US009097770B2

(12) United States Patent
Kitahara et al.

(10) Patent No.: US 9,097,770 B2
(45) Date of Patent: Aug. 4, 2015

(54) BATTERY VOLTAGE DETECTION DEVICE, ASSEMBLED BATTERY MANAGEMENT SYSTEM

(71) Applicants: Naoki Kitahara, Aichi (JP); Tomohiro Sawayanagi, Nagano (JP); Yuichi Ikeda, Nagano (JP)

(72) Inventors: Naoki Kitahara, Aichi (JP); Tomohiro Sawayanagi, Nagano (JP); Yuichi Ikeda, Nagano (JP)

(73) Assignee: OMRON AUTOMOTIVE ELECTRONICS CO., LTD., Aichi (JP)

( * ) Notice: Subject to any disclaimer, the term of this patent is extended or adjusted under 35 U.S.C. 154(b) by 0 days.

(21) Appl. No.: 14/180,948

(22) Filed: Feb. 14, 2014

(65) Prior Publication Data

US 2014/0232413 A1 Aug. 21, 2014

(30) Foreign Application Priority Data

Feb. 15, 2013 (JP) ................................ 2013-027963

(51) Int. Cl.
*H02J 7/00* (2006.01)
*G01R 31/36* (2006.01)

(52) U.S. Cl.
CPC .......... *G01R 31/362* (2013.01); *G01R 31/3658* (2013.01)

(58) Field of Classification Search
CPC ...................................................... H02J 7/0016
USPC .......................................................... 320/118
See application file for complete search history.

(56) References Cited

U.S. PATENT DOCUMENTS

| | | | | |
|---|---|---|---|---|
| 6,075,344 | A | 6/2000 | Kawai | |
| 6,104,164 | A | 8/2000 | Iino et al. | |
| 2006/0103351 | A1 * | 5/2006 | Tanigawa et al. | 320/118 |
| 2008/0090133 | A1 * | 4/2008 | Lim et al. | 429/50 |
| 2009/0325060 | A1 | 12/2009 | Komaki et al. | |

FOREIGN PATENT DOCUMENTS

| | | | |
|---|---|---|---|
| JP | H08-19188 | A | 1/1996 |
| JP | H11-252809 | A | 9/1999 |
| JP | 2000-199771 | A | 7/2000 |
| JP | 2008-076339 | A | 4/2008 |
| JP | 2010-009991 | A | 1/2010 |
| JP | 2012-220344 | A | 11/2012 |

* cited by examiner

*Primary Examiner* — Edward Tso
*Assistant Examiner* — Ahmed Omar
(74) *Attorney, Agent, or Firm* — Osha Liang LLP

(57) ABSTRACT

An assembled battery management system has an assembled battery having a plurality of battery modules connected in series, wherein each of the battery modules has a plurality of battery cells connected in series, a connection member that connects the plurality of battery modules, and a battery voltage detection device that detects voltages of the battery cells. The battery voltage detection device has a monitoring section having a voltage detector that detects the voltages of the battery cells, wherein the monitoring section monitors the voltages of the battery cells based on a detection result of the voltage detector, and a plurality of voltage input terminals connected to the monitoring section. Each of the battery modules includes a plurality of voltage detection terminals connected to a positive electrode and a negative electrode of each of the modules as well as connecting points of the battery cells.

11 Claims, 4 Drawing Sheets

Vt: POTENTIAL DIFFERENCE OF VOLTAGE DETECTION TERMINAL OF HIGHEST POTENTIAL AND VOLTAGE DETECTION TERMINAL OF LOWEST POTENTIAL
Vb: VOLTAGE DROP AMOUNT BY BUS BAR
Vtn: NET TOTAL BATTERY CELL VOLTAGE
V1 to V11: VOLTAGE OF EACH BATTERY CELL
Vis: TOTAL OF BATTERY CELL VOLTAGES

BATTERY VOLTAGE DETECTION DEVICE, ASSEMBLED BATTERY MANAGEMENT SYSTEM

BACKGROUND OF THE INVENTION

1. Technical Field

The present invention relates to a technique for detecting a voltage of each battery cell with respect to an assembled battery in which a plurality of battery modules, each being formed by connecting a plurality of battery cells in series, are connected in series by a connection member.

2. Related Art

As disclosed in Japanese Unexamined Patent Publication No. 2010-9991, Japanese Unexamined Patent Publication No. 2000-199771, and Japanese Unexamined Patent Publication No. 2008-76339, for example, an assembled battery configured by connecting a plurality of battery modules, each configured by connecting a plurality of battery cells in series, in series is proposed. As disclosed in Japanese Unexamined Patent Publication No. 2010-9991, a connection member such as a bus bar, a lead wire, and the like is used for the connection of the battery modules. As disclosed in Japanese Unexamined Patent Publication No. 2012-220344, Japanese Unexamined Patent Publication No. 8-19188, and Japanese Unexamined Patent Publication No. 11-252809, an assembled battery configured by connecting a plurality of battery cells in series is also proposed.

A voltage detection terminal extends from each of both electrodes of the assembled battery and from between the battery cells. The ends of the voltage detection terminals are connected to the ends of voltage input terminals arranged in a voltage detection unit of a battery voltage detection device. The voltage detection unit measures a potential difference among the voltage detection terminals through the voltage input terminals, and detects the voltage of each battery cell based on the measurement result.

Japanese Unexamined Patent Publication No. 2000-199771, Japanese Unexamined Patent Publication No. 2008-76339, and Japanese Unexamined Patent Publication No. 2012-220344 disclose a battery voltage detection device for accurately detecting the voltage of each battery cell of the assembled battery.

In Japanese Unexamined Patent Publication No. 2000-199771, the voltage on both sides of each battery cell is divided with a resistance voltage dividing circuit, and then detected with the voltage detection unit. A reference potential of each battery module is transmitted to the voltage detection unit through a switch and a diode of the resistance voltage dividing circuit. Furthermore, the voltage that cancels out the voltage drop by the switch and the diode of the resistance voltage dividing circuit is indicated to the voltage detection unit by a switch and a diode of a compensation circuit.

In Japanese Unexamined Patent Publication No. 2008-76339, the battery modules are connected in series by a fuse. The voltage detection unit detects a voltage of a connecting point of the battery cells with respect to an intermediate reference point of one end of the fuse, and a voltage of a connecting point of the other end of the fuse with respect to the intermediate reference point and the battery module. A computation circuit computes the voltage of one or a plurality of battery cells and the voltage drop by the fuse based on the detection result of the voltage detection unit, and furthermore, corrects the voltage of the battery cell by the voltage drop by the fuse.

In Japanese Unexamined Patent Publication No. 2012-220344, the voltage measurement unit measures the voltage of each battery cell through the voltage detection terminal. A contact resistance calculation unit calculates a contact resistance generated at each voltage detection terminal. The voltage computation unit calculates the voltage of each battery cell using the measurement result of the voltage measurement unit and the calculation result of the contact resistance calculation unit.

The detected voltage of each battery cell is output to a controller and used to perform charging control, abnormality determination, and the like, as disclosed in Japanese Unexamined Patent Publication No. 8-19188 and Japanese Unexamined Patent Publication No. 11-252809.

In Japanese Unexamined Patent Publication No. 8-19188, a control device calculates a voltage difference of a minimum voltage and another voltage of the voltages of the battery cells, and starts or stops the charging with respect to each battery cell based on the result of comparing each voltage difference and a predetermined value.

In Japanese Unexamined Patent Publication No. 11-252809, the voltage of the assembled battery is also detected in addition to the voltage of each battery cell. Specifically, an assembled voltage detection circuit detects the voltage of the assembled battery through the voltage detection terminal connected to both electrodes of the assembled battery, and outputs the detection result to the control circuit. The control circuit calculates the sum of the voltages of the battery cells, and determines the presence or absence of abnormality based on the result of comparing the sum and the voltage of the assembled battery.

If a great number of battery modules are connected in series to configure the assembled battery, the capacity of the assembled battery becomes large but the number of battery cells and voltage detection terminals also increases. There is a limit to the number of voltage input terminals and the voltage detection performance in the voltage detection unit of one battery voltage detection device. Thus, if there are a great number of battery modules and battery cells configuring the assembled battery, the voltage of each battery cell cannot be detected with one battery voltage detection device.

The number of battery modules and battery cells configuring the assembled battery varies depending on the application of the assembled battery and the like. Thus, the number of voltage detection terminals in one or a plurality of designed battery modules may not match the number of voltage input terminals in the existing battery voltage detection device. If the battery voltage detection device is to be developed in such a case so that the number of terminals becomes the same for the one or the plurality of battery modules, the versatility lowers.

Furthermore, if the battery modules are connected by way of a connection member such as a bus bar, the voltage drop occurs when the current flows through the connection member. Thus, the voltage of each battery cell may not be accurately detected in the voltage detection unit.

SUMMARY

According to one or more embodiments of the present invention, a battery voltage detection device and an assembled battery management system have high versatility and capable of accurately detecting voltages of battery cells of the assembled battery.

In accordance with one or more embodiments of the present invention, a battery voltage detection device is related to a device configured to detect voltages of battery cells of an assembled battery configured by connecting in series a plurality of battery modules, each being formed by connecting in series a plurality of battery cells, by a connection member, the battery voltage detection device including a monitoring section including a voltage detection unit configured to detect the voltages of the battery cells, the monitoring section being configured to monitor the voltages of the battery cells based on a detection result of the voltage detection unit; and a plurality of voltage input terminals connected to the monitoring section. Each of the battery modules includes a plurality of voltage detection terminals connected to a positive electrode and a negative electrode of each of the modules as well as connecting points of the battery cells. The number of the voltage input terminals in one battery voltage detection device is different from the number of the voltage detection terminals in one or a plurality of the battery modules; and the battery voltage detection device is arranged in plurals and the voltage detection terminals are connected to the voltage input terminals without leaving remains.

In accordance with one or more embodiments of the present invention, an assembled battery management system includes an assembled battery configured by connecting in series a plurality of battery modules, each configured by connecting in series a plurality of battery cells, by a connection member, and a battery voltage detection device configured to detect voltages of the battery cells. The battery voltage detection device includes a monitoring section including a voltage detection unit configured to detect the voltages of the battery cells, the monitoring section being configured to monitor the voltages of the battery cells based on a detection result of the voltage detection unit, and a plurality of voltage input terminals connected to the monitoring section. Each of the battery modules includes a plurality of voltage detection terminals connected to a positive electrode and a negative electrode of each of the modules as well as connecting points of the battery cells. The number of the voltage input terminals in one battery voltage detection device is different from the number of the voltage detection terminals in one or a plurality of the battery modules; and the battery voltage detection device is arranged in plurals, and the voltage detection terminals are connected to the voltage input terminals without leaving remains.

According to the description made above, a plurality of voltage detection terminals are arranged at the positive electrode and the negative electrode of the assembled battery, connecting points of the battery cells, and connecting points of the battery modules and the connection members. Furthermore, even if the number of voltage detection terminals in one or a plurality of battery modules is different from the number of the voltage input terminals in one battery voltage detection device, all the voltage detection terminals can be connected to the voltage input terminals by arranging the battery voltage detection device in plurals. Thus, even if there are a great number of battery modules and battery cells configuring the assembled battery, the voltages of the battery cells can be detected without being influenced by the voltage drop by the connection member through the voltage input terminals and the voltage detection terminals at the voltage detection units of the plurality of battery voltage detection devices. The battery voltage detection device can be used in a versatile manner regardless of the number of battery modules, battery cells, and voltage detection terminals. The battery voltage detection device and the assembled battery management system according to one or more embodiments of the present invention have high versatility, and can accurately detect the voltages of the battery cells of the assembled battery.

In one or more embodiments of the present invention, the voltage detection unit may measure the potential difference among the voltage detection terminals connected to the voltage input terminals, and detect the voltages of the battery cells and the voltage drop amount by the connection member based on the measurement result.

In one or more embodiments of the present invention, the battery voltage detection device may further include a total potential measurement unit configured to measure a potential difference between the voltage detection terminal having a highest potential and the voltage detection terminal having a lowest potential among the voltage detection terminals connected to the voltage input terminals; and an abnormality determination unit configured to determine presence or absence of abnormality based on the measurement result of the total potential measurement unit and the detection result of the voltage detection unit.

Furthermore, in one or more embodiments of the present invention, the abnormality determination unit may determine presence or absence of abnormality based on a result of comparing a value obtained by subtracting the voltage drop amount by the connection member detected by the voltage detection unit from the potential difference measured by the total potential measurement unit, and a total value of the voltages of the battery cells detected by the voltage detection unit.

Furthermore, in one or more embodiments of the present invention, an assembled battery management device connected to each of the battery voltage detection devices may be further arranged, wherein the assembled battery management device may include a control unit, and an assembled battery potential measurement unit configured to measure a potential difference between the voltage detection terminal having a highest potential and the voltage detection terminal having a lowest potential of the assembled battery: and the control unit may calculate each of a total value of the voltages of all the battery cells in the assembled battery and a total value of the voltage drop amounts by all the connection members, and determine presence or absence of abnormality based on the calculation result and the measurement result of the assembled battery potential measurement unit.

According to one or more embodiments of the present invention, a battery voltage detection device and an assembled battery management system having high versatility and capable of accurately detecting voltages of the battery cells of the assembled battery can be provided.

DETAILED DESCRIPTION

Figure 1:
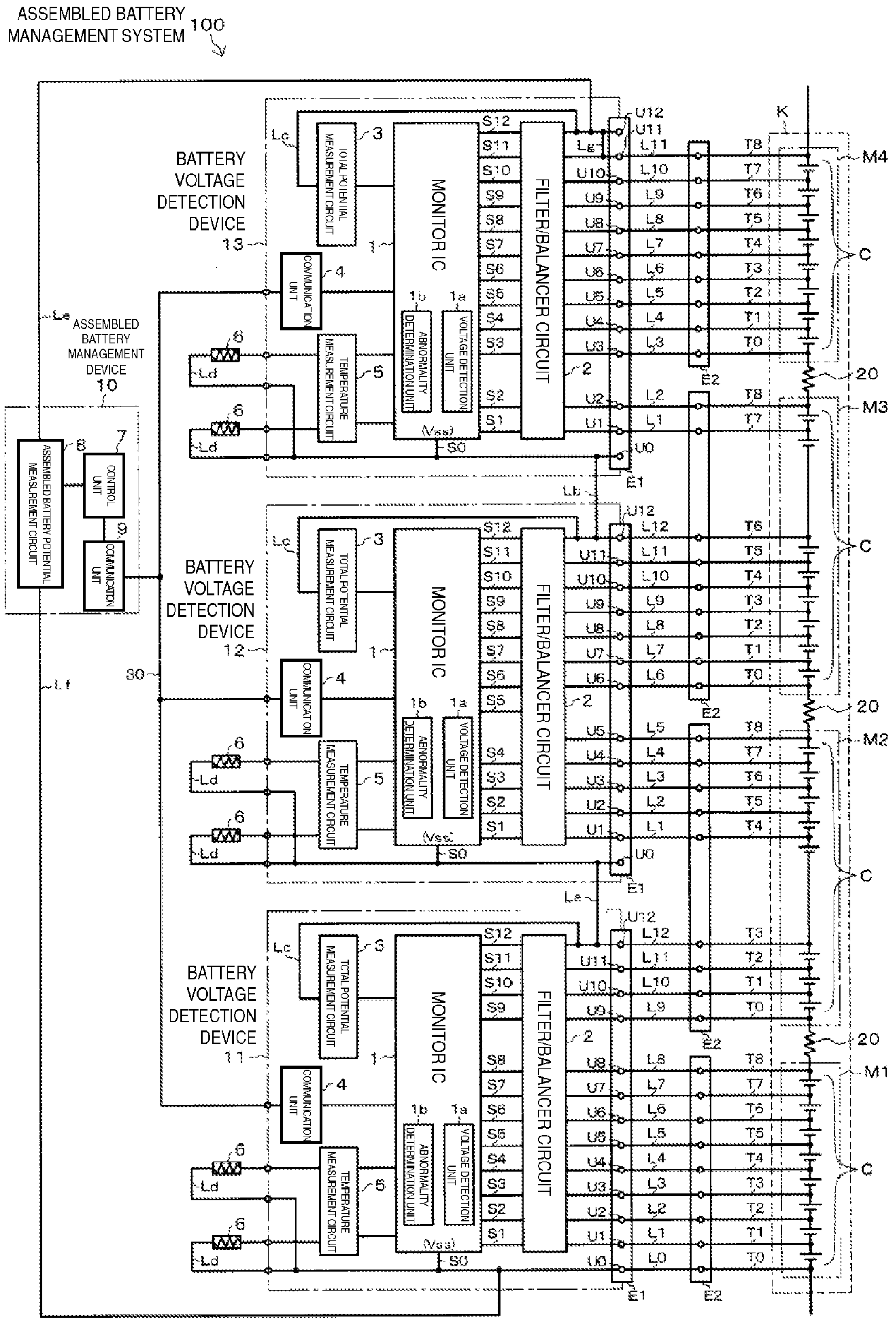
FIG. 1 is a diagram showing an assembled battery management system according to one or more embodiments of the present invention.

Embodiment of the present invention will be hereinafter described with reference to the drawings. In each figure, the same reference numerals are denoted on similar portions or corresponding portions. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

First, a configuration of an assembled battery management system 100 according to one or more embodiments of the present invention will be described with reference to FIG. 1.

The assembled battery management system 100 is mounted on, for example, an electric vehicle such as an electric automobile, an electric two-wheeled vehicle, and the like. The assembled battery management system 100 includes an assembled battery K, battery voltage detection devices 11 to 13, and an assembled battery management device 10. The battery voltage detection devices 11 to 13 are arranged in plurals, each of which being connected with the assembled battery management device 10 with a communication line 30.

The assembled battery K is a power supply of a motor of the electric vehicle. A plurality of battery cells C (eight in the present example) are connected in series to configure each battery module M1 to M4. A plurality of battery modules M1 to M4 (four in the present example) are connected in series by bus bars 20 to configure the assembled battery K. The bus bar 20 serves as an example of a "connection member" of one or more embodiments of the present invention.

Each battery module M1 to M4 includes a plurality of voltage detection terminals T0 to T8. Specifically, nine voltage detection terminals T0 to T8 are arranged in each battery module M1 to M4 so as to be derived from the positive electrode and the negative electrode of each battery module M1 to M4 as well as connecting points of the battery cells C. That is, one ends of the voltage detection terminals T0 to T8 are connected to the positive electrode and the negative electrode of the assembled battery K, the connecting points of the battery cells C, and the connecting points of the battery modules M1 to M4 and the bus bars 20. The other ends of the voltage detection terminals T0 to T8 are connected to a connector E2. The connector E2 is a relay connector, and is connected to a connector E1 by voltage detection lines L0 to L12.

Each battery voltage detection device 11 to 13 includes a monitor IC 1, a filter/balancer circuit 2, a total potential measurement circuit 3, a communication unit 4, a temperature measurement circuit 5, and the connector E1, which are mounted on one substrate. The monitor IC 1 includes a voltage detection unit 1*a* and an abnormality determination unit 1*b*. The monitor IC 1 monitors the voltage as well as the presence/absence of abnormality of the battery cells C based on the detection result of the voltage detection unit 1*a* and the determination result of the abnormality determination unit 1*b*. The monitor IC 1 monitors the temperature of the battery cells C based on the measurement result of the temperature measurement circuit 5. The monitor IC 1 serves as an example of a "monitoring section" of one or more embodiments of the present invention.

The connector E1 of each battery voltage detection device 11 to 13 includes a plurality of voltage input terminals U0 to U12. One ends of connection lines S0 to S12 are connected to the voltage input terminals U0 to U12, respectively. The other ends of the connection lines S0 to S12 are connected to terminals (not shown) of the monitor IC 1. Therefore, the monitor IC 1 is connected to the voltage input terminals U0 to U12 by way of the connection lines S0 to S12. The filter/balancer circuit 2 is connected to the connection lines S1 to S12 excluding the connection line S0.

The number (13 in the present example) of the voltage input terminals U0 to U12 in one of the battery voltage detection devices 11 to 13 is different from the number (9×N, N is number of battery modules) of the voltage detection terminals T0 to T8 in one or a plurality of battery modules M1 to M4.

The voltage detection terminals T0 to T8 are connected to the voltage input terminals U0 to U12 of the connector E1 through the connector E2 and the voltage detection lines L0 to L12 without leaving remains.

Accordingly, the voltage detection terminals T0 to T8 of the battery module M1 and the voltage detection terminals T0 to T3 of the battery module M2 are connected to the monitor IC 1 of the battery voltage detection device 11. Furthermore, the voltage detection terminals T4 to T8 of the battery module M2 and the voltage detection terminals T0 to T6 of the battery module M3 are connected to the monitor IC 1 of the battery voltage detection device 12. Furthermore, the voltage detection terminals T7, T8 of the battery module M3 and the voltage detection terminals T0 to T8 of the battery module M4 are connected to the monitor IC 1 of the battery voltage detection device 13.

The monitor IC 1 of the battery voltage detection device 11 acquires a reference potential Vss through the connection line S0, the voltage input terminal U0, the voltage detection line L0, the connector E2, and the voltage detection terminal T0 of the battery module M1.

The monitor IC 1 of the battery voltage detection device 12 acquires the reference potential Vss through connection line S0, the connection line La, the voltage input terminal U12 of the battery voltage detection device 11, the adjacent voltage detection line L12, the connector E2, and the voltage detection terminal T3 of the battery module M2.

The monitor IC 1 of the battery voltage detection device 13 acquires the reference potential Vss through connection line S0, the connection line Lb, the voltage input terminal U12 of the battery voltage detection device 12, the adjacent voltage detection line L12, the connector E2, and the voltage detection terminal T6 of the battery module M3.

The voltage detection unit 1*a* of the monitor IC 1 measures the potential difference among the voltage detection terminals T0 to T8 through the connection lines S0 to S12, the voltage input terminals U0 to U12, the voltage detection lines L0 to L12, the connection lines La, Lb and the connector E2. The voltage of each battery cell C at the connecting destination and the voltage drop amount by the bus bar 20 are respectively detected based on the measurement result.

The filter/balancer circuit 2 is configured by a filter, a discharging circuit, and the like (not shown), and corrects the variation of the voltage among the battery cells C to equalize the battery voltage. The discharging circuit is arranged in plurals in correspondence with each of the battery cells C, and is controlled by the monitor IC 1. The monitor IC 1 drives the discharging circuit and prioritizes discharging for the battery cell of high voltage, and does not drive the discharging circuit and prioritizes charging for the battery cell of low voltage. The voltage of each battery cell C is thus equalized.

The total potential measurement circuit 3 is connected to the monitor IC 1. One end of a measurement line Lc is connected to the total potential measurement circuit 3. In the battery voltage detection devices 11, 12, the other end of the measurement line Lc is connected to the voltage input terminal U12 at the highest potential of the voltage detection devices 11, 12. In the battery voltage detection device 13, the other end of the measurement line Lc is connected to the voltage input terminal U11 at the highest potential of the battery voltage detection device 13 through a connection line Lg.

The total potential measurement circuit 3 measures a potential difference between the voltage detection terminal at the highest potential and the voltage detection terminal at the lowest potential among the voltage detection terminals T0 to T8 connected to the monitor IC 1. The total potential measurement circuit 3 serves as an example of a "total potential measurement unit" of one or more embodiments of the present invention.

Specifically, the total potential measurement circuit 3 of the battery voltage detection device 11 measures the potential difference between the voltage detection terminal T3 of the battery module M2 at the highest potential and the voltage detection terminal T0 of the battery module M1 at the lowest potential among the voltage detection terminals T0 to T8 of the battery module M1 and the voltage detection terminals T0 to T3 of the battery module M2 connected to the monitor IC 1.

The total potential measurement circuit 3 of the battery voltage detection device 12 measures the potential difference between the voltage detection terminal T6 of the battery module M3 at the highest potential and the voltage detection terminal T4 of the battery module M2 at the lowest potential among the voltage detection terminals T4 to T8 of the battery module M2 and the voltage detection terminals T0 to T6 of the battery module M3 connected to the monitor IC 1.

The total potential measurement circuit 3 of the battery voltage detection device 13 measures the potential difference between the voltage detection terminal T8 of the battery module M4 at the highest potential and the voltage detection terminal T7 of the battery module M3 at the lowest potential among the voltage detection terminals T7 to T8 of the battery module M3 and the voltage detection terminals T0 to T8 of the battery module M4 connected to the monitor IC 1.

The temperature measurement circuit 5 is connected to the monitor IC 1. The thermistor 6 is arranged on each of the pair of measurement lines Ld derived from the temperature measurement circuit 5. The end of each measurement line Ld is connected to the connection line S0 for acquiring the reference potential Vss. Each thermistor 6 is arranged in the vicinity of the battery module M1 to M4. The temperature measurement circuit 5 measures the temperature in the vicinity of the battery modules M1 to M4 with the thermistor 6.

In each monitor IC 1, the detection result of the voltage detection unit 1*a*, the measurement result of the total potential measurement circuit 3, and the measurement result of the temperature measurement circuit 5 are input to the abnormality determination unit 1*b*. The abnormality determination unit 1*b* determines the presence or absence of abnormality of the battery cell C at the connecting destination based on the detection result of the voltage detection unit 1*a* and the measurement result of the total potential measurement circuit 3.

The monitor IC 1 transmits the detection result of the voltage detection unit 1*a*, the measurement result of the temperature measurement circuit 5, and the determination result of the abnormality determination unit 1*b* to the assembled battery management device 10 through the communication line 30 by the communication unit 4.

The assembled battery management device 10 includes the control unit 7, the assembled battery potential measurement circuit 8, and the communication unit 9. The control unit 7 receives the detection result of the voltage detection unit 1*a*, the measurement result of the temperature measurement circuit 5, and the determination result of the abnormality determination unit 1*b* from each battery voltage detection device 11 to 13 through the communication line 30 by the communication unit 9. The abnormality determination unit 1*b* may be arranged in the control unit 7 instead of arranging the abnormality determination unit 1*b* in the monitor IC 1.

The assembled battery potential measurement circuit 8 is connected to the control unit 7. Measurement lines Le, Lf are derived from the assembled battery potential measurement circuit 8, and the end of one measurement line Le is connected to the voltage input terminal U11 of the battery voltage detection device 13 through the connection line Lg. The end of the other measurement line Lf is connected to the voltage input terminal U0 of the battery voltage detection device 11.

Thus, the assembled battery potential measurement circuit 8 measures the potential difference between the voltage detection terminal T8 of the battery module M4 at the highest potential and the voltage detection terminal T0 of the battery module M1 at the lowest potential in the assembled battery K. The assembled battery potential measurement circuit 8 serves as an example of an "assembled battery potential measurement unit" of one or more embodiments of the present invention.

When receiving the detection result of the voltage detection unit 1*a* from each battery voltage detection device 11 to 13, and the measurement result from the assembled battery potential measurement circuit 8, the control unit 7 determines the presence or absence of abnormality of the assembled battery K based on such information.

The control unit 7 also controls the input/output of the power of the assembled battery K and the like based on the measurement result of the temperature measurement circuit 5 and the determination result of the abnormality determination unit 1*b* received from each battery voltage detection device 11 to 13, as well as the determination result on the abnormality of the assembled battery K.

The operation of each battery voltage detection device 11 to 13 will now be described with reference to FIG. 1 to FIG. 4. A case of the battery voltage detection device 11 will be described by way of example for the sake of convenience of explanation, but the operation is similar for the battery voltage detection devices 12, 13.

Figure 2:
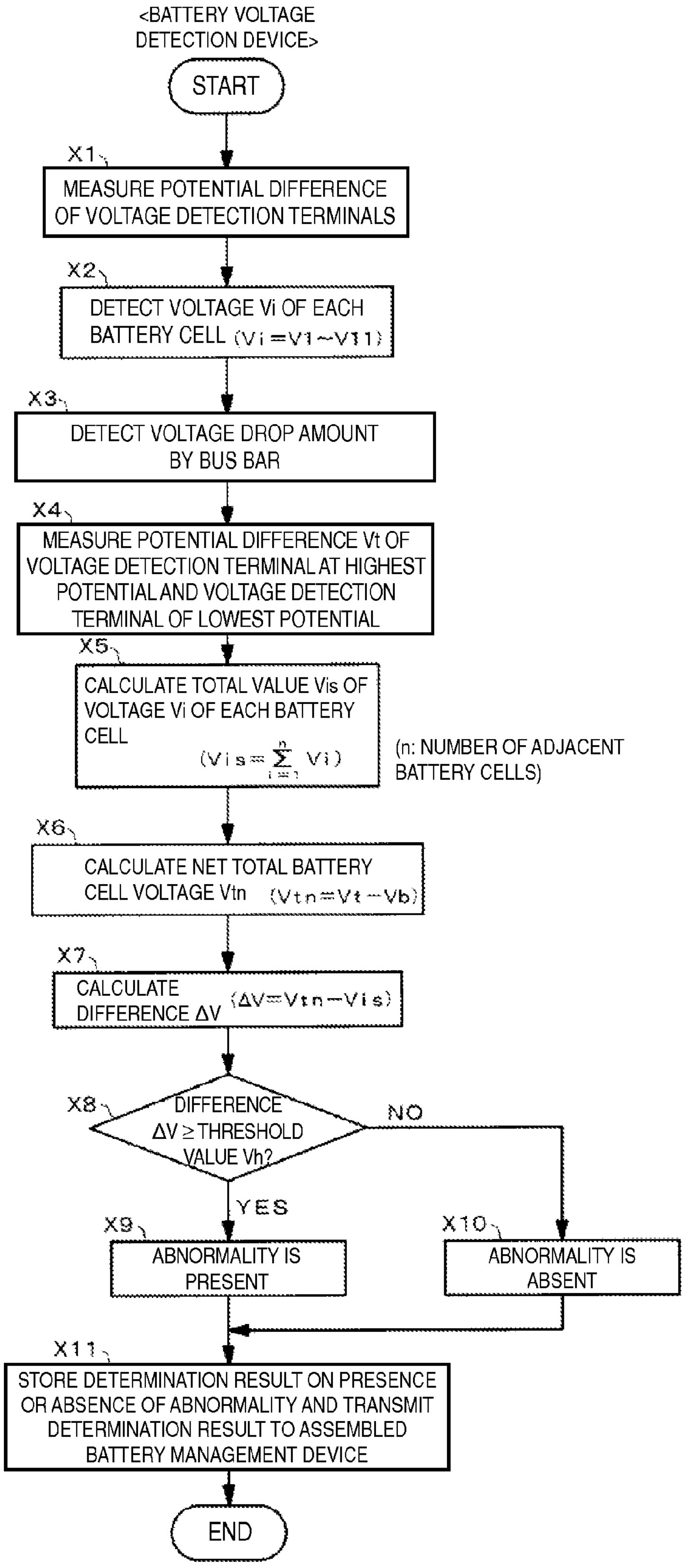
FIG. 2 is a flowchart showing an operation of a battery voltage detection device of FIG. 1.

First, the voltage detection unit 1*a* of each monitor IC 1 measures the potential difference among the voltage detection terminals T0 to T8 connected to the voltage input terminals U0 to U12 (step X1 of FIG. 2). In this case, for example, the potential differences between the voltage detection terminal serving as the reference potential Vss and the other voltage detection terminals are sequentially measured.

Figure 3:
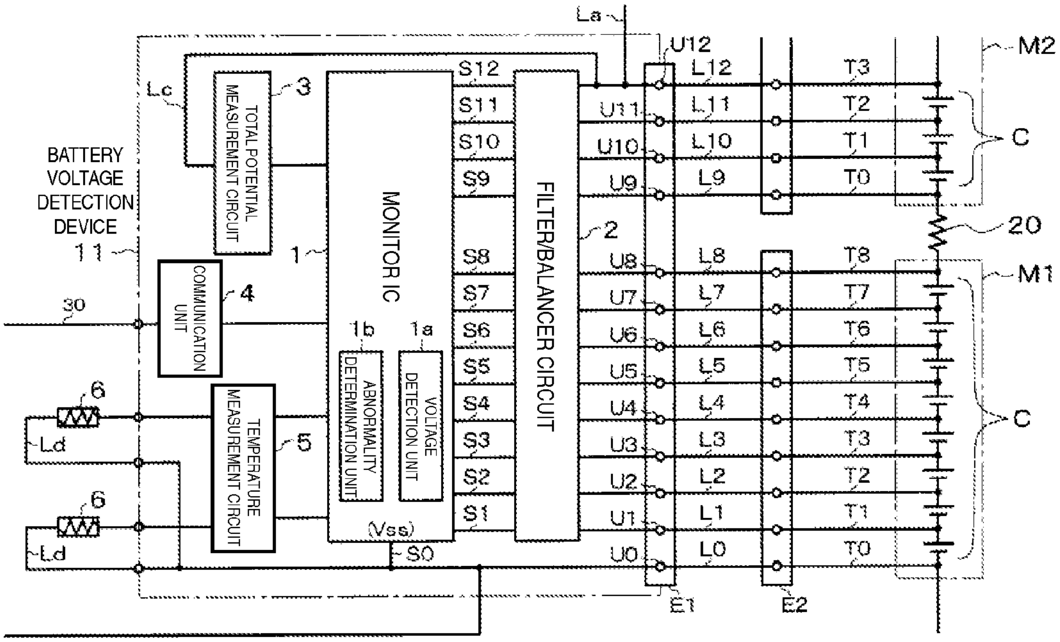
FIG. 3 is a diagram showing a part of the assembled battery management system of FIG. 1.

In the battery voltage detection device 11 shown in FIG. 3, the potential differences between the voltage detection terminal T0 of the battery module M1 serving as the reference potential Vss and the other voltage detection terminals T1 to T8 of the battery module M1 as well as the voltage detection terminals T0 to T3 of the battery module M2 are sequentially measured.

The voltage detection unit 1*a* then detects the voltage Vi of each battery cell C at the connecting destination (step X2 of FIG. 2) and detects a voltage drop amount Vb by the bus bar 20 (step X3) based on the measured potential differences.

In the battery voltage detection device 11 of FIG. 3, the voltages Vi (i=1 to 11) of the eleven battery cells C each between two of the voltage detection terminals T0 to T8 of the battery module M1 and the voltage detection terminals T0 to T3 of the battery module M2 is detected. In other words, each voltage Vi (i=1 to 8) of all the eight battery cells C of the battery module M1 and each voltage (i=9 to 11) of the three battery cells C from the lowest potential side of the battery module M2 are detected.

The voltage drop amount Vb by one bus bar 20 between the voltage detection terminal T8 of the battery module M1 and the voltage detection terminal T0 of the battery module M2 is detected.

The specification of the voltage Vi of the battery cell C and the voltage drop amount Vb by the bus bar 20 is, for example, carried out by the voltage detection unit 1*a* based on information that indicates that the battery cell C or the bus bar 20 is connected between adjacent two of voltage input terminals U0 to U12, the information stored in advance in the monitor IC 1.

There is a clear difference between the voltage Vi of each battery cell C and the voltage drop amount Vb by the bus bar 20. Therefore, as another example, the potential difference among the voltage input terminals U0 to U12 may be detected with the voltage detection unit 1*a* of each monitor IC 1, and the voltage Vi of each battery cell C and the voltage drop amount Vb by the bus bar 20 may be extracted from the detection result.

The total potential measurement circuit 3 measures a potential difference Vt between the voltage detection terminal at the highest potential and the voltage detection terminal at the lowest potential among the voltage detection terminals T0 to T8 connected to the monitor IC 1 through voltage input terminals U0 to U12 (step X4 of FIG. 2).

In the battery voltage detection device 11 of FIG. 3, the voltage difference Vt between the voltage detection terminal T3 of the battery module M2 at the highest potential and the voltage detection terminal T0 of the battery module M1 at the lowest potential is measured. The measurement value Vt includes not only the voltages V1 to V11 of the eleven battery cells C between the voltage detection terminal T3 of the battery module M2 and the voltage detection terminal T0 of the battery module M1, but also the voltage drop Vb by one bus bar 20 (see FIG. 4).

Figure 4:
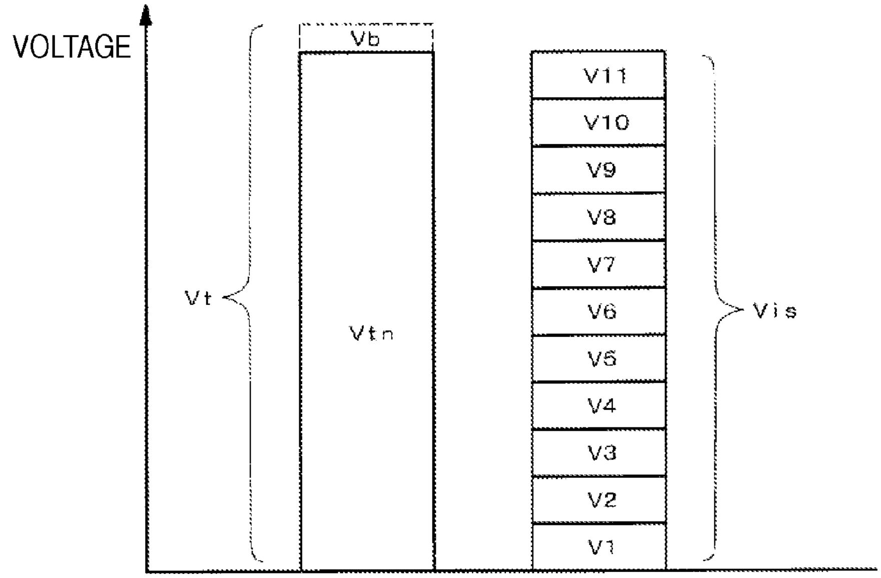
FIG. 4 is a diagram showing an example of a voltage measurement result of the battery voltage detection device of FIG. 1.

The abnormality determination unit 1*b* then calculates a total value Vis of the voltages Vi of the battery cells C detected by the voltage detection unit 1*a* (step X5 of FIG. 2, see FIG. 4). The voltage drop amount Vb by the bus bar 20 detected by the voltage detection unit 1*a* is subtracted from the potential difference Vt measured by the total potential measurement circuit 3 to calculate a net total battery cell voltage Vtn (step X6 of FIG. 2, see FIG. 4).

The abnormality determination unit 1*b* calculates a difference ΔV between the net total battery cell voltage Vtn and the total value Vis (step X7 of FIG. 2), and determines whether or not the difference ΔV is greater than or equal to a predetermined threshold value Vh (step X8). If the difference ΔV is greater than or equal to the predetermined threshold value Vh (step X8: YES), the abnormality determination unit 1*b* determines that abnormality is present (step X9). If the difference ΔV is smaller than the predetermined threshold value Vh (step X8: NO), the abnormality determination unit 1*b* determines that abnormality is absent (step X10).

Thereafter, the abnormality determination unit 1*b* stores the determination result on the presence or absence of abnormality in the internal memory of the monitor IC 1 and also transmits the determination result to the assembled battery management device 10 by the communication unit 4 (step X11).

The operation of the assembled battery management device 10 will now be described with reference to FIG. 5.

First, the data indicating the voltage Vi of each battery cell C and the voltage drop amount Vb by the bus bar 20 detected by the voltage detection unit 1*a* is received by the communication unit 9 from each battery voltage detection device 11 to 13 (step Y1). The control unit 7 then calculates the total value Via of the voltages Vi of all the battery cells C in the assembled battery K (step Y2). The total value Vba of the voltage drop amount Vb by all the bus bars 20 is also calculated (step Y3).

The assembled battery potential measurement circuit 8 then measures the potential difference Vk between the voltage detection terminal T8 of the battery module M4 at the highest potential in the assembled battery K and the voltage detection terminal T0 of the battery module M1 at the lowest potential (step Y4). The control unit 7 then subtracts the total value Vba of the voltage drop amounts Vb by the bus bars 20 from the potential difference Vk measured by the assembled battery potential measurement circuit 8 to calculate the net assembled battery voltage Vkn (step Y5).

The control unit 7 then calculates a difference ΔVd of the net assembled battery voltage Vkn and the total value Via (step Y6), and determines whether or not the difference ΔVd is greater than or equal to a predetermined threshold value Vha (step Y7). If the difference ΔVd is greater than or equal to the predetermined threshold value Vha (step Y7: YES), the control unit 7 determines that abnormality is present in the assembled battery K (step Y8). If the difference ΔVd is smaller than the predetermined threshold value Vha (step Y7: NO), the control unit 7 determines that abnormality is absent in the assembled battery K (step Y9).

Thereafter, the control unit 7 stores the determination result on the presence or absence of abnormality in the internal memory (step Y10).

According to one or more of the embodiments described above, the plurality of voltage detection terminals T0 to T8 are arranged at the positive electrode and the negative electrode of the assembled battery K, the connecting points of the battery cells C, and the connecting points of battery modules M1 to M4 and the bus bars 20.

Even if the number of voltage detection terminals T0 to T8 in the one or a plurality of battery modules M1 to M4 and the number of voltage input terminals U0 to U12 in one of the battery voltage detection devices 11 to 13 are different, all the voltage detection terminals T0 to T8 can be connected to the voltage input terminals U0 to U12 by arranging the battery voltage detection devices 11 to 13 in plurals.

Thus, even if the battery modules M1 to M4 and the battery cells C configuring the assembled battery K are in great number, the voltage Vi of each battery cell C and the voltage drop amount Vb by the bus bar 20 can be separately detected through each terminal U0 to U12 and T0 to T8 with the voltage detection unit 1*a* of the monitor IC 1 of the battery voltage detection device 11 to 13.

The battery voltage detection devices 11 to 13 and the monitor IC 1 can be used in a versatile manner regardless of the number of battery modules M1 to M4, the battery cells C, and the voltage detection terminals T0 to T8.

Thus, the battery voltage detection devices 11 to 13 and the assembled battery management system 100 have high versatility, and can accurately detect the voltage Vi of each battery cell C of the assembled battery K.

In one or more of the embodiments described above, the voltage difference Vt between the voltage detection terminal at the highest potential and the voltage detection terminal at the lowest potential is measured by the total potential measurement circuit 3 in each battery voltage detection device 11 to 13. The presence or absence of abnormality of the plurality of battery cells C can be detected based on the potential difference Vt, the voltage Vi of each battery cell C, and the voltage drop amount Vb by the bus bar 20 detected by the voltage detection unit 1*a*.

In particular, the potential difference Vt measured by the total potential measurement circuit 3 includes the voltage drop amount Vb by the bus bar 20. Thus, the presence or absence of abnormality of the battery cell C can be accurately detected by comparing the net total battery cell voltage Vtn obtained by subtracting the voltage drop amount Vb from the potential difference Vt and the total Vis of the voltage Vi of each battery cell C.

Furthermore, in one or more of the embodiments described above, the potential difference Vk between the voltage detection terminal T8 of the battery module M4 at the highest potential and the voltage detection terminal T0 of the battery module M1 at the lowest potential of the assembled battery K is measured by the assembled battery potential measurement circuit 8 in the assembled battery management device 10. The presence or absence of abnormality of the assembled battery K can be accurately detected based on the potential difference Vk, the total value Via of the voltages Vi of all the battery cells C detected by each battery voltage detection device 11 to 13, and the total value Vba of the voltage drop amounts Vb by all the bus bars 20.

The present invention can adopt various embodiments other than those described above. For example, in one or more of the embodiments described above, a case in which the number of voltage input terminals U0 to U12 in each battery voltage detection device 11 to 13 is greater than the number of the voltage detection terminals T0 to T8 in each battery module M1 to M4 is shown by way of example, but the present invention is not limited thereto. For example, the number of voltage input terminals in one battery voltage detection device may be less than the number of voltage detection terminals in one battery module, or may be greater than the number of voltage detection terminals in a plurality of battery modules.

In one or more of the embodiments described above, an example in which the battery modules M1 to M4 are connected by way of the bus bars 20 has been described, but the present invention is not limited thereto. For example, the battery modules M1 to M4 may be connected using other connection members such as a lead wire or a fuse.

Figure 5:
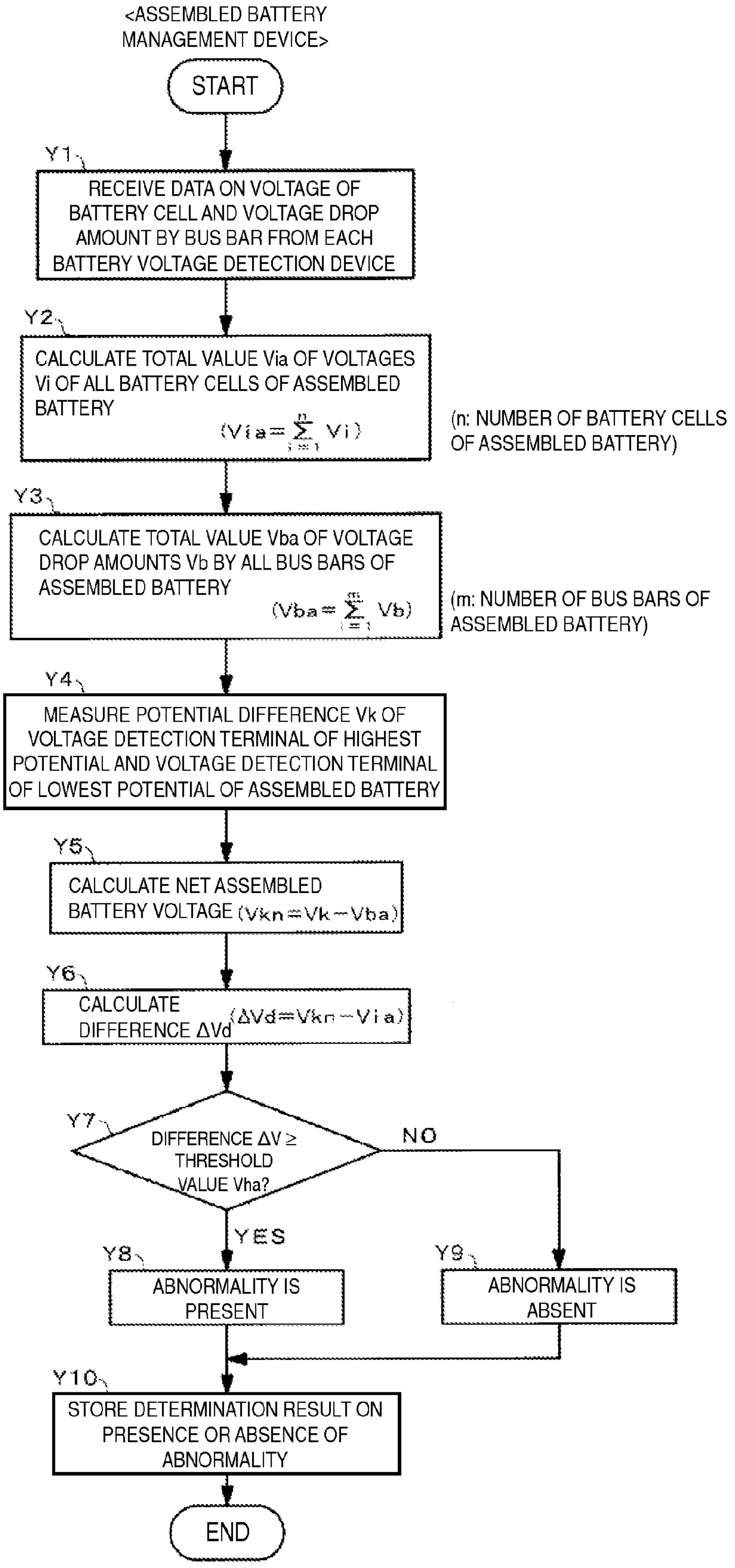
FIG. 5 is a flowchart showing an operation of the assembled battery management device of FIG. 1.

Furthermore, in one or more of the embodiments of FIG. 2 and FIG. 5, an example in which the values Vtn, Vkn obtained by subtracting the voltage drop amounts Vb, Vba by the bus bar 20 from the potential differences Vt, Vk measured by the total potential measurement circuit 3 and the assembled battery potential measurement circuit 8 are compared with the voltage total values Vis, Via of the battery cells C to determine abnormality has been described, but the present invention is not limited thereto. For example, the value obtained by adding the voltage drop amounts Vb, Vba by the bus bar 20 to the voltage total values Vis, Via of the battery cells C and the potential differences Vt, Vk measured with the total potential measurement circuit 3 and the assembled battery potential measurement circuit 8 may be compared to determine the presence or absence of abnormality from the comparison result.

In each battery voltage detection device 11 to 13, the voltages Vi of the battery cells C detected by the voltage detection unit 1*a* may be compared to determine the presence or absence of abnormality of each battery cell C from the comparison result.

In one or more of the embodiments described above, an example in which the voltage input terminals U0 to U12 are arranged in the connector E1 has been described, but the connector E1 may be omitted, and the voltage input terminals U0 to U12 may be directly arranged on the substrate mounted with the monitor IC 1 and the like.

Furthermore, in one or more of the embodiments described above, an example in which the relay connector E2 is arranged and the connector E1 and the connector E2 are connected by way of the voltage detection lines L0 to L12 has been described, but the present invention is not limited thereto. The connector E2 and the voltage detection lines L0 to L12 may be omitted, and the voltage detection terminals T0 to T8 may be directly connected to the voltage input terminals U0 to U12 of the connector E1.

In one or more of the embodiments described above, an example in which the temperature measurement circuit 5 is arranged in each of the battery voltage detection devices 11 to 13 has been described, but the temperature measurement circuit 5 may be omitted.

Furthermore, above, an example in which one or more embodiments of the present invention is applied to the assembled battery management system 100 and the battery voltage detection devices 11 to 13 to be mounted on an electric vehicle has been described, but one or more embodiments of the present invention can also be applied to the assembled battery management system and the battery voltage detection device to be mounted on a hybrid vehicle driven by electricity and other fuels, for example. One or more embodiments of the present invention can also be applied to the assembled battery management system not including the assembled battery management device 10.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A battery voltage detection device configured to detect voltages of battery cells of an assembled battery comprising a plurality of battery modules connected in series by a connection member, wherein each of the battery modules comprises a plurality of battery cells connected in series, the battery voltage detection device comprising:

a monitoring section comprising a voltage detector that detect the voltages of the battery cells, wherein the monitoring section monitors the voltages of the battery cells based on a detection result of the voltage detector; and a plurality of voltage input terminals connected to the monitoring section;

wherein each of the battery modules includes a plurality of voltage detection terminals connected to a positive electrode and a negative electrode of each of the modules as well as connecting points of the battery cells;

wherein a number of the voltage input terminals in the battery voltage detection device is different from the number of the voltage detection terminals in one or a plurality of the battery modules; and wherein the battery voltage detection device is arranged in plurals and the voltage detection terminals are connected to the voltage input terminals without leaving remains.

2. The battery voltage detection device according to claim 1, wherein the voltage detector measures a potential difference among the voltage detection terminals connected to the voltage input terminals, and detects the voltages of the battery cells and a voltage drop amount by the connection member based on a measurement result.

3. The battery voltage detection device according to claim 2, further comprising:

a total potential measurement unit that measures a potential difference between the voltage detection terminal having a highest potential and the voltage detection terminal having a lowest potential among the voltage detection terminals connected to the voltage input terminals; and an abnormality determination unit that determines a presence or an absence of abnormality based on a measurement result of the total potential measurement unit and the detection result of the voltage detector.

4. The battery voltage detection device according to claim 3, wherein the abnormality determination unit determines the presence or the absence of abnormality based on a result of comparing a value obtained by subtracting the voltage drop amount by the connection member detected by the voltage detector from the potential difference measured by the total potential measurement unit, and a total value of the voltages of the battery cells detected by the voltage detector.

5. An assembled battery management system comprising:

an assembled battery comprising a plurality of battery modules connected in series, wherein each of the battery modules comprises a plurality of battery cells connected in series;

a connection member that connects the plurality of battery modules; and a battery voltage detection device that detects voltages of the battery cells, wherein the battery voltage detection device comprises:

a monitoring section comprising a voltage detector that detects the voltages of the battery cells, wherein the monitoring section monitors the voltages of the battery cells based on a detection result of the voltage detector, and a plurality of voltage input terminals connected to the monitoring section, wherein each of the battery modules includes a plurality of voltage detection terminals connected to a positive electrode and a negative electrode of each of the modules as well as connecting points of the battery cells, wherein a number of the voltage input terminals in one battery voltage detection device is different from the number of the voltage detection terminals in one or a plurality of the battery modules, and wherein the battery voltage detection device is arranged in plurals, and the voltage detection terminals are connected to the voltage input terminals without leaving remains.

6. The assembled battery management system according to claim 5, wherein the voltage detector measures a potential difference among the voltage detection terminals connected to the voltage input terminals, and detects the voltages of the battery cells and a voltage drop amount by the connection member based on a measurement result.

7. The assembled battery management system according to claim 6, wherein the battery voltage detection device comprises:

a total potential measurement unit that measures a potential difference between the voltage detection terminal having a highest potential and the voltage detection terminal having a lowest potential among the voltage detection terminals connected to the voltage input terminals, and an abnormality determination unit that determines a presence or an absence of abnormality based on a measurement result of the total potential measurement unit and the detection result of the voltage detector.

8. The assembled battery management system according to claim 7, wherein the abnormality determination unit determines the presence or the absence of abnormality based on a result of comparing a value obtained by subtracting the voltage drop amount by the connection member detected by the voltage detector from the potential difference measured by the total potential measurement unit, and a total value of the voltages of the battery cells detected by the voltage detector.

9. The assembled battery management system according to claim 6, further comprising:

an assembled battery management device connected to each of the battery voltage detection devices, wherein the assembled battery management device comprises:

a control unit, and an assembled battery potential measurement unit configured to measure a potential difference between the voltage detection terminal having a highest potential and the voltage detection terminal having a lowest potential of the assembled battery, and wherein the control unit calculates each of a total value of the voltages of all the battery cells in the assembled battery and a total value of the voltage drop amounts by all the connection members, and determines presence or absence of abnormality based on a calculation result and a measurement result of the assembled battery potential measurement unit.

10. The assembled battery management system according to claim 7, further comprising:

an assembled battery management device connected to each of the battery voltage detection devices, wherein the assembled battery management device comprises:

a control unit, and an assembled battery potential measurement unit configured to measure a potential difference between the voltage detection terminal having a highest potential and the voltage detection terminal having a lowest potential of the assembled battery, and wherein the control unit calculates each of a total value of the voltages of all the battery cells in the assembled battery and a total value of the voltage drop amounts by all the connection members, and determines presence or absence of abnormality based on a calculation result and a measurement result of the assembled battery potential measurement unit.

11. The assembled battery management system according to claim 8, further comprising:

an assembled battery management device connected to each of the battery voltage detection devices, wherein the assembled battery management device comprises:

a control unit, and an assembled battery potential measurement unit configured to measure a potential difference between the voltage detection terminal having a highest potential and the voltage detection terminal having a lowest potential of the assembled battery, and wherein the control unit calculates each of a total value of the voltages of all the battery cells in the assembled battery and a total value of the voltage drop amounts by all the connection members, and determines presence or absence of abnormality based on a calculation result and a measurement result of the assembled battery potential measurement unit.

* * * * *